(12) United States Patent  
Cheng et al.

(10) Patent No.: US 8,492,241 B2
(45) Date of Patent: Jul. 23, 2013

(54) METHOD FOR SIMULTANEOUSLY FORMING A THROUGH SILICON VIA AND A DEEP TRENCH STRUCTURE

(75) Inventors: Kangguo Cheng, Guilderland, NY (US); Mukta G Farooq, Hopewell Junction, NY (US); Louis L Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 12/904,348

(22) Filed: Oct. 14, 2010

(65) Prior Publication Data

US 2012/0091593 A1    Apr. 19, 2012

(51) Int. Cl.
*H01L 21/8249* (2006.01)
*H01L 21/76* (2006.01)

(52) U.S. Cl.
USPC ............ 438/447; 438/243; 438/435; 257/774

(58) Field of Classification Search
USPC ........................... 257/774; 438/243, 427, 435
See application file for complete search history.

(56) References Cited

U.S. PATENT DOCUMENTS

| | | | |
|---|---|---|---|
| 6,924,551 B2 | 8/2005 | Rumer et al. | |
| 7,109,123 B2 | 9/2006 | Mimura et al. | |
| 7,317,256 B2 | 1/2008 | Williams et al. | |
| 7,400,024 B2 | 7/2008 | Kunnen | |
| 7,531,420 B2 | 5/2009 | Nirschl et al. | |
| 2002/0066916 A1* | 6/2002 | Hsu et al. | 257/301 |
| 2004/0238936 A1 | 12/2004 | Rumer et al. | |
| 2006/0273455 A1 | 12/2006 | Williams et al. | |
| 2007/0158725 A1* | 7/2007 | Cheng et al. | 257/301 |
| 2008/0024197 A1* | 1/2008 | Bernstein et al. | 327/530 |
| 2008/0073747 A1 | 3/2008 | Chao et al. | |
| 2008/0079121 A1* | 4/2008 | Han | 257/621 |
| 2008/0081398 A1 | 4/2008 | Lee et al. | |
| 2008/0182359 A1* | 7/2008 | Horton et al. | 438/106 |
| 2009/0152650 A1* | 6/2009 | Chudzik et al. | 257/410 |
| 2010/0041203 A1* | 2/2010 | Collins et al. | 438/386 |
| 2010/0044853 A1* | 2/2010 | Dekker et al. | 257/692 |
| 2010/0178747 A1* | 7/2010 | Ellul et al. | 438/386 |
| 2010/0178761 A1* | 7/2010 | Chen et al. | 438/613 |
| 2010/0200949 A1 | 8/2010 | Booth, Jr. et al. | |

* cited by examiner

*Primary Examiner* — N Drew Richards
*Assistant Examiner* — Karen Kusumakar
(74) *Attorney, Agent, or Firm* — Matthew C. Zehrer; Joseph Petrokaitis

(57) ABSTRACT

A through silicon via (TSV) and a deep trench capacitor (DTCap) or a deep trench isolation (DTI) are simultaneously formed on the same substrate by a single mask and a single reactive ion etching (RIE). The TSV trench is wider and deeper that the DTCap or DTI trench. The TSV and DTCap or DTI are formed with different dielectric materials on the trench sidewalls. The TSV and DTCap or DTI are perfectly aligned.

20 Claims, 15 Drawing Sheets

METHOD FOR SIMULTANEOUSLY FORMING A THROUGH SILICON VIA AND A DEEP TRENCH STRUCTURE

BACKGROUND OF THE INVENTION

The present invention relates generally to a method for simultaneously forming a through silicon via and a deep trench structure and, more specifically, to structures and methods for simultaneously forming a through silicon via and a deep trench capacitor or a deep trench isolation.

Through-silicon-via (TSV) is becoming a viable technology approach for improving chip performance at the system level by 3-D chip integration. On-chip decoupling capacitors are highly desired to suppress power fluctuation. Deep trench capacitors (DTCap) have a capacitance density advantage over other planar capacitors due to the fact that the capacitors can be formed in deep trenches in a semiconductor substrate. Furthermore, deep trench isolation (DTI) is becoming necessary for future CMOS technologies and beyond. Deep trench etching is very challenging and costly. The issue is exacerbated due to different and sometimes competing requirements of TSV, DTCap, and DTI. For example, TSV and DTI require a thick dielectric on the trench sidewall to provide sufficient insulation between the trench and the substrate and to reduce the parasitic capacitance. In contrast, DTCap requires a thin dielectric on the trench sidewall to maximize the capacitance gain in a deep trench capacitance. Given the high-aspect ratio of deep trenches, however, processing one type of trench (e.g., TSV) while protecting the other kind of trench (e.g., DTCap or DTI) is extremely challenging, if not all possible and is not cost-effective.

SUMMARY OF THE INVENTION

In a first aspect of the invention, a method of forming a device includes providing a substrate. The method includes depositing a pad film on top of the substrate. The method includes simultaneously forming a first trench and a second trench in the substrate, wherein the first trench is wider and deeper than the second trench. The method includes depositing a node dielectric layer on the pad film and on a bottom and sidewalls of both the first trench and the second trench. The method includes depositing a first material over the node dielectric layer to completely fill the second trench and partially fill the first trench. The method includes removing all of the first material from the first trench and some of the first material from the second trench. The method includes depositing a liner on sidewalls of the first trench. The method includes depositing a conductive material to fill the first trench. The method includes planarizing the conductive material. The method further includes thinning the substrate to the node dielectric layer at the bottom of the first trench. The method also includes removing the node dielectric layer from the bottom of the first trench.

In a further aspect of the invention, a method of forming a device includes providing a substrate. The method includes depositing a pad film on top of the substrate. The method includes simultaneously forming a wide trench for a through silicon via (TSV) and a narrow trench for a deep trench capacitor (DTCap) in the substrate. The method includes depositing a node dielectric layer on the pad film and on a bottom and sidewalls of both the wide trench and the narrow trench. The method includes depositing a first conductive material over the node dielectric layer to completely fill the narrow trench and partially fill the wide trench. The method includes removing all of the first conductive material from the wide trench and some of the first conductive material from the narrow trench. The method includes depositing a liner on sidewalls of the wide trench. The method includes depositing a second conductive material to fill the wide trench. The method includes planarizing the second conductive material. The method further includes thinning the substrate to the node dielectric layer at a bottom of the wide trench. The method also includes removing the node dielectric layer from the bottom of the wide trench.

In a further aspect of the invention, a method of forming a device includes providing a substrate. The method includes depositing a pad film on top of the substrate. The method includes simultaneously forming a through silicon via (TSV) trench and a deep trench isolation (DTI) trench in the substrate. The method includes depositing an insulating material to completely fill the DTI trench and partially fill the TSV trench. The method includes removing insulting material from the TSV trench and the DTI trench, wherein a spacer liner is formed on sidewalls of the TSV trench. The method includes depositing a conductive material to fill the TSV trench. The method further includes planarizing the conductive material. The method also includes thinning the substrate to a bottom of the TSV trench.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

Disclosed herein is a structure and method for simultaneously forming a TSV and a DTCap or DTI on the same chip. By taking advantage of reactive ion etching (RIE) loading effects in deep trenches, a narrow DTCap or DTI trench and a wide TSV trench can be formed by a single mask and a single trench RIE, resulting in the TSV trench being deeper than the DTCap or DTI trench. A TSV and DTCap or DTI are formed with different dielectric materials on the trench sidewalls, improving device performance, without requiring any extra mask and lithography. The TSV and DTCap or DTI are perfectly aligned. No misalignment occurs.

Figure 1:
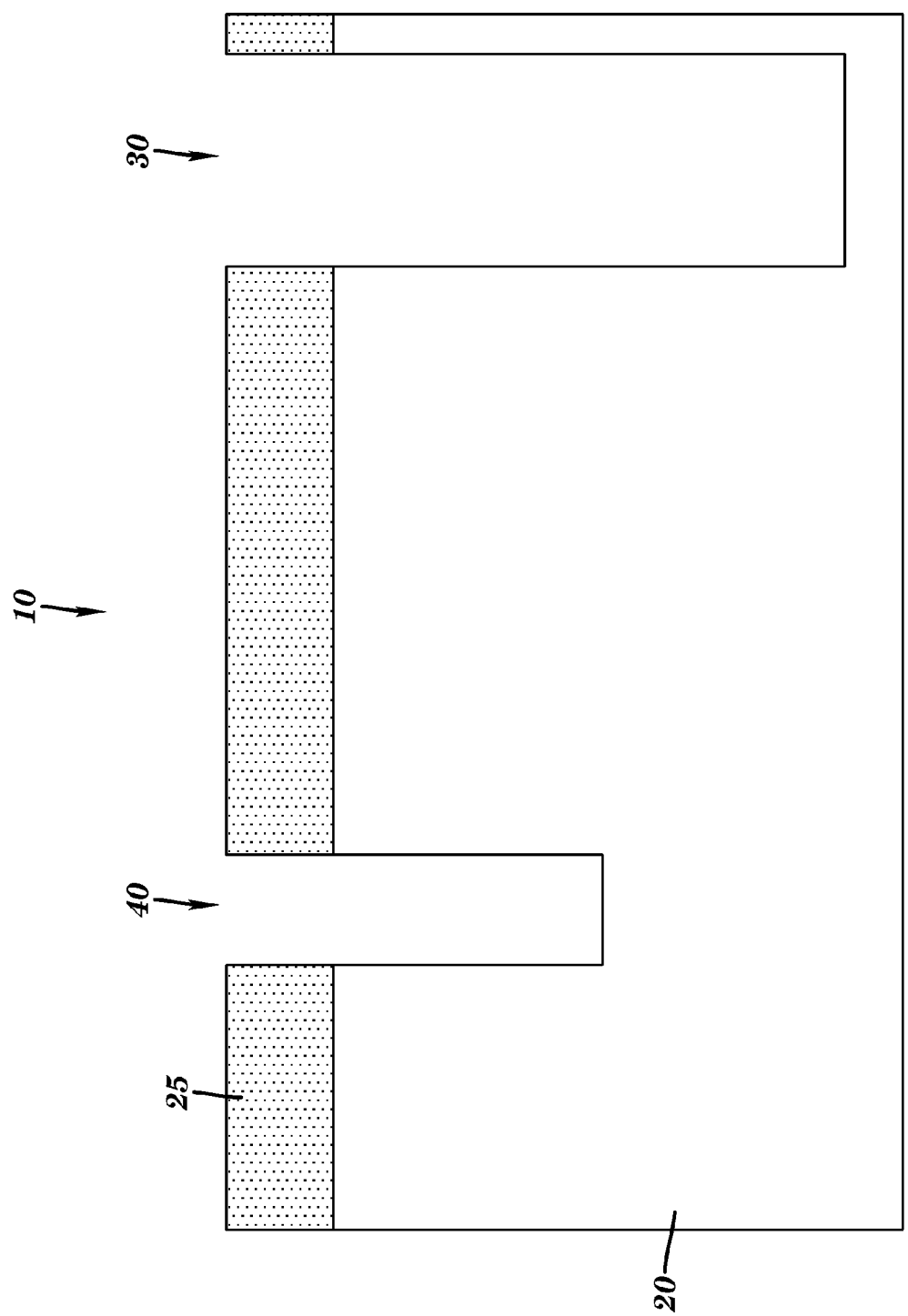
FIG. 1 shows a starting structure and processing steps in accordance with an embodiment of the invention.

Referring to FIG. 1, a starting structure 10 includes a substrate 20. Substrate 20 may be a bulk semiconductor substrate, such as silicon, germanium or silicon germanium, a semiconductor-on-insulator (SOI) or other substrate known in the art. A pad film 25 is deposited on top of substrate 20. Pad film 25 may be deposited by conventional deposition methods such as chemical vapor deposition (CVD), atomic layer deposition (ALD), rapid thermal chemical vapor deposition (RTCVD), plasma enhanced chemical vapor deposition (PECVD) or any other known or later developed methods. Pad film 25 may comprise silicon nitride, silicon dioxide or other materials or combination of materials. Pad film 25 may have a thickness in a range from about 30 nm to 150 nm. Deep trenches 30, 40 are formed in substrate 20 by using conventional patterning techniques such as lithography and conventional etch processing such as RIE. Pad film 25 may be used as a mask. A wide trench 30 is formed for a TSV. A narrow trench 40 is formed for a DTCap. Due to the difference of trench openings, wide trench 30 is deeper than narrow trench 40 after RIE. Trench 30 may have a width in a range from about 2 um to 100 um. Trench 30 may have a depth in a range from about 10 um to 500 um. Trench 30 may have an aspect ratio (ratio between trench depth and trench width) in a range from about 5 to 50. Trench 40 may have a width in a range from about 0.1 um to 1 um. Trench 40 may have a depth in a range from about 3 um to 20 um. Trench 40 may have an aspect ratio (ratio between trench depth and trench width) in a range from about 5 to 50.

Figure 2:
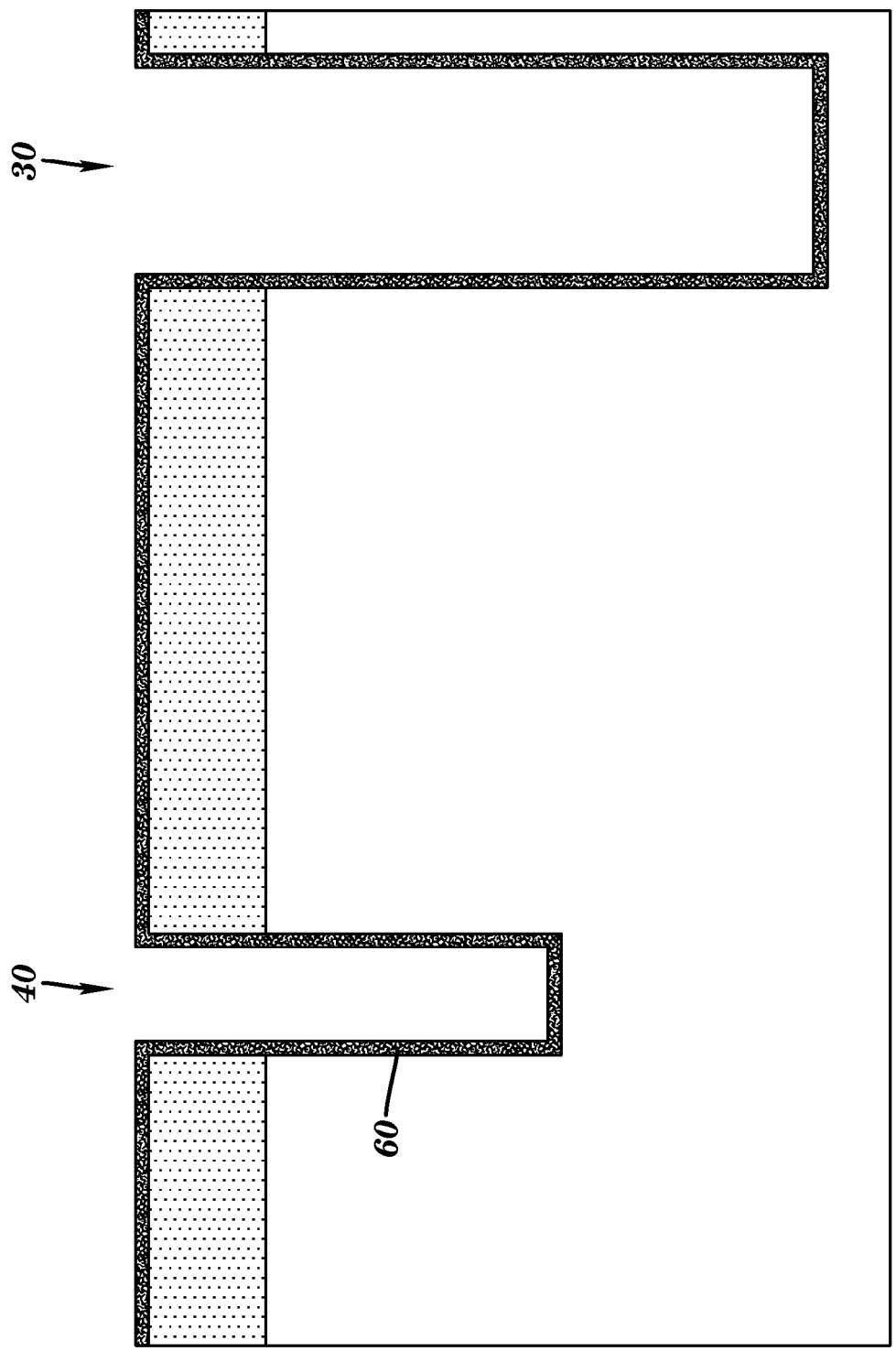
FIGS. 2-7 show processing steps and intermediate structures in accordance with an embodiment of the invention.

Referring to FIG. 2, a thin node dielectric layer 60 is deposited on pad film and on the sidewalls and at the bottom of trenches 30, 40. Node dielectric layer 60 may be deposited by conventional deposition methods such as CVD, ALD or any other known or later developed methods. Node dielectric layer 60 may include, but is not limited to: silicon nitride, silicon oxide, oxynitride and high-k dielectric. Node dielectric layer 60 may have a thickness in a range from about 3 nm to 20 nm. Node dielectric layer 60 enhances deep trench capacitance; however, the TSV needs a thick liner to ensure insulation and reduce parasitic capacitance. The thicker TSV liner will be formed in a later process.

Figure 3:
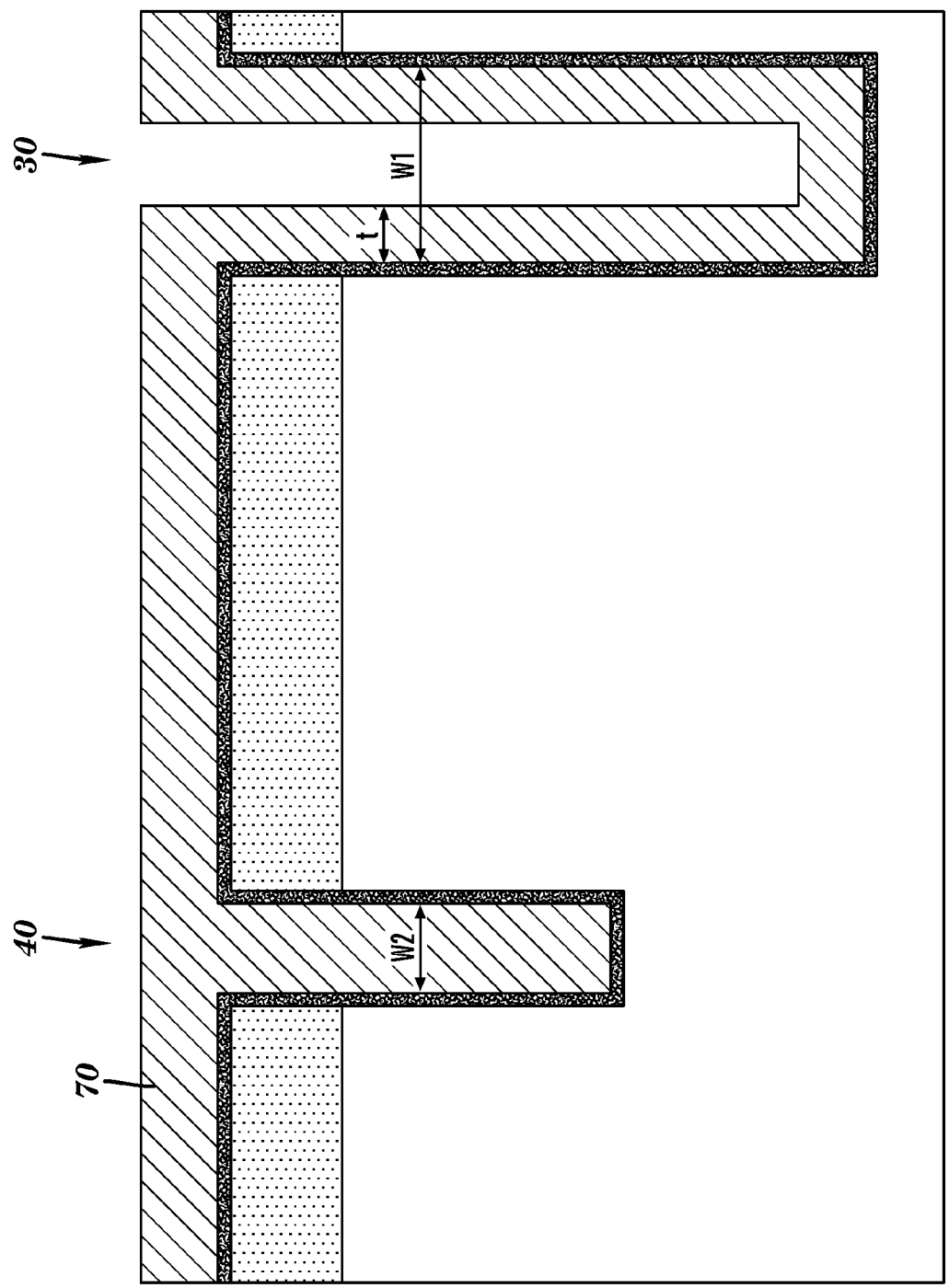

Referring to FIG. 3, conductive material 70 is conformally deposited over node dielectric layer 60 to completely fill DTCap trench 40 and partially fill TSV trench 30. Conductive material 70 may include, but is not limited to: polycrystalline or amorphous silicon, germanium, silicon germanium, a metal, such as tungsten, titanium, tantalum, ruthenium, zirconium, cobalt, copper, aluminum, lead, platinum, tin, silver or gold, a conducting metallic compound material, such as tantalum nitride, titanium nitride, tungsten silicide, tungsten nitride, ruthenium oxide, cobalt silicide or nickel silicide, carbon nanotube, conductive carbon, or any suitable combination of these materials. The conductive material may further comprise dopants that are incorporated during or after deposition. Conductive material 70 may be deposited by conventional deposition methods such as low pressure chemical vapor deposition (LPCVD) or any other known or later developed methods. Conductive material 70 may have a thickness of t which is greater than half the width, W2, of DTCap trench 40, but less than half the width, W1, of TSV trench 30 (i.e., ½*W2<t<½*W1). For example, W2 may be in a range of 0.1 um to 1 um, W1 may be in a range of 5 um to 50 um and t may be in a range of 1 um to 2 um.

Figure 4:
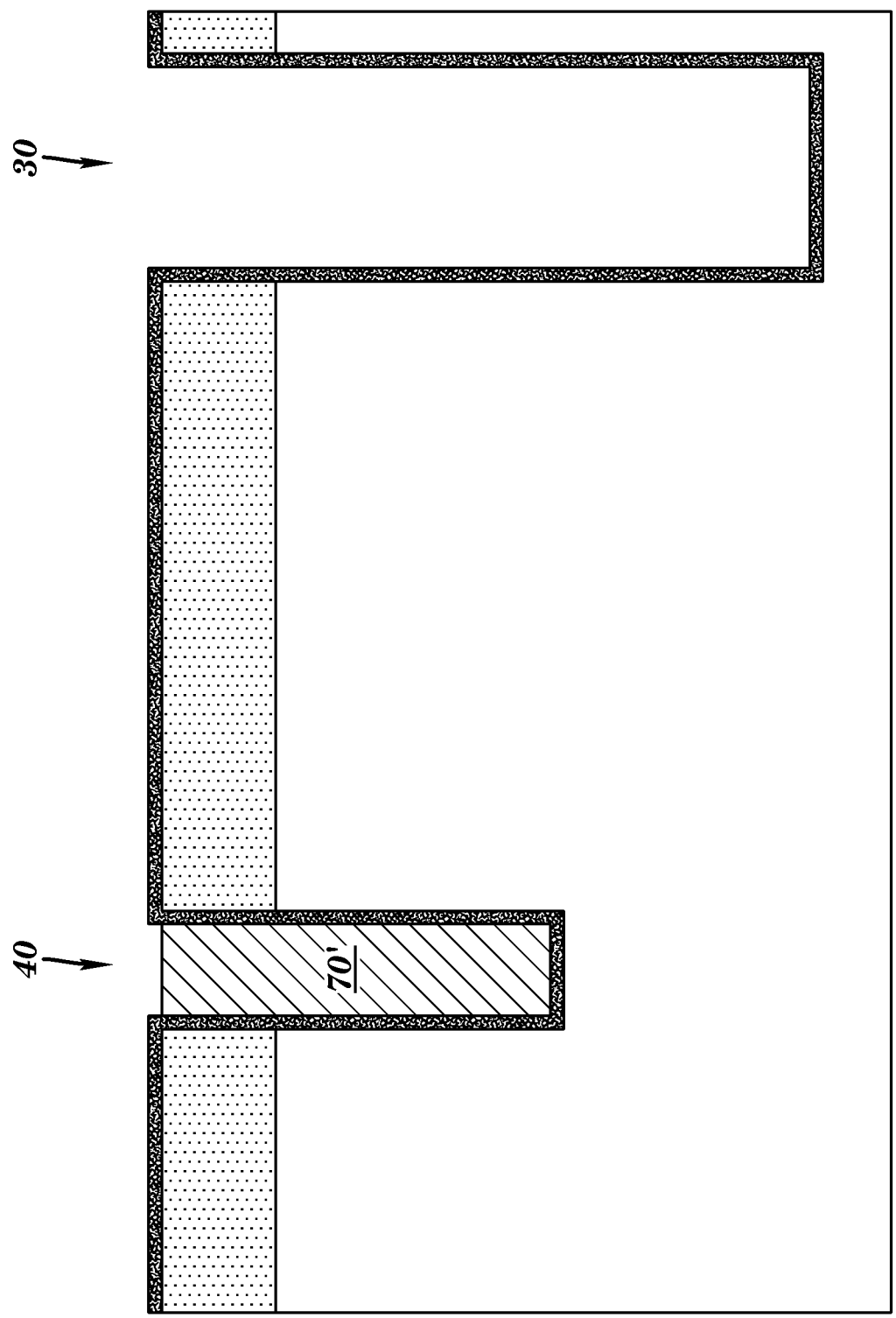

Referring to FIG. 4, conductive material 70 is removed from TSV trench 30 and DTCap trench 40. Conductive material 70, depending on its chemical components, may be removed by any suitable techniques. In one embodiment, the conductive material 70 comprises doped silicon and it can be removed by wet etching, using an etch solution containing ammonia or TMAH, by dry etching using a plasma etch or chemical downstream etch or any other known or later developed methods. Conductive material 70' remains in DTCap trench 40.

Figure 5:
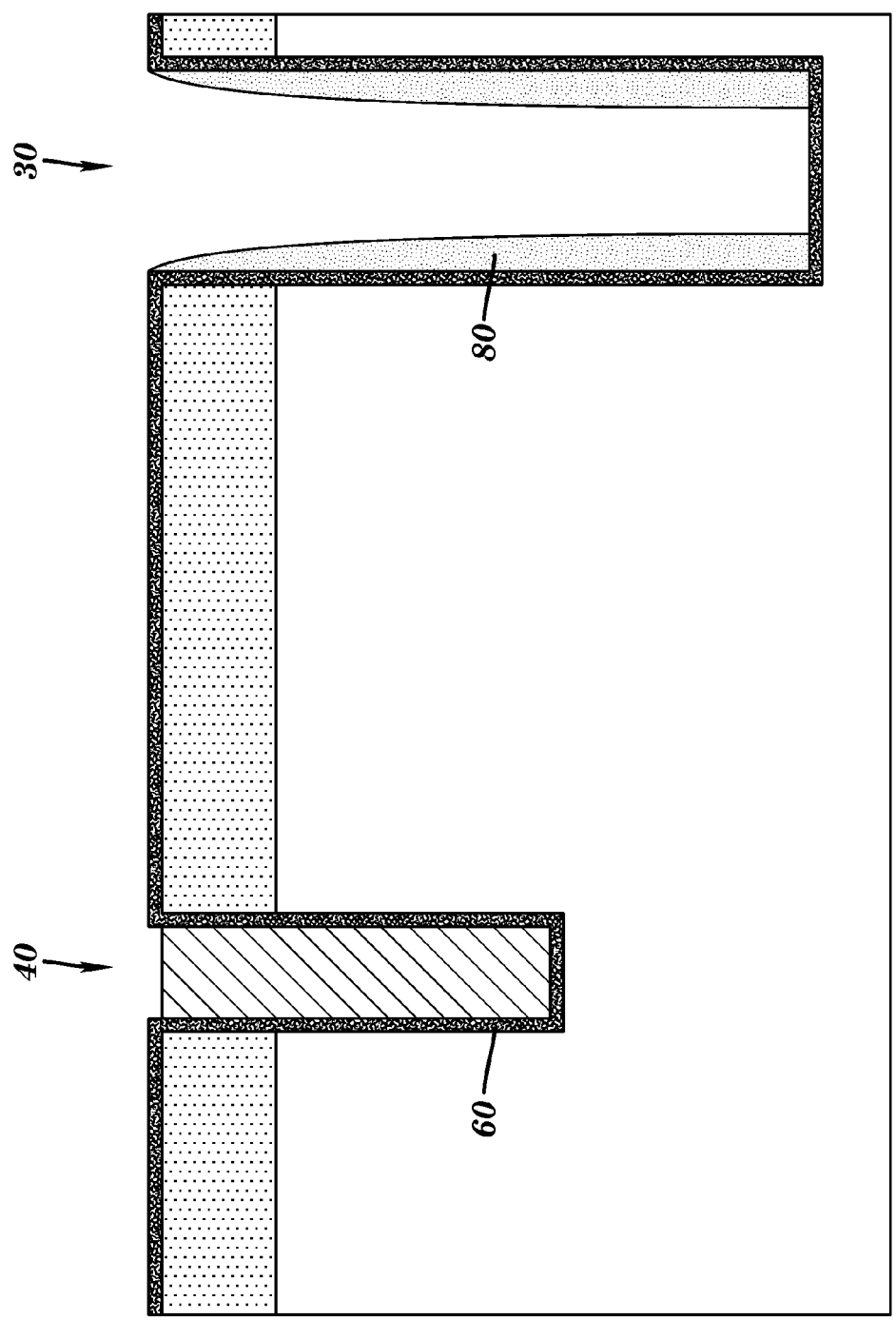

Referring to FIG. 5, a thick liner 80 is deposited on the sidewalls of TSV trench 30. Liner 80 may be deposited by chemical vapor deposition (CVD) or any other known or later developed methods. Liner 80 may comprise an oxide or other material known in the art. Liner 80 may have a thickness in a range from about 10 nm to 100 nm. Alternatively, node dielectric 60 may be removed from the sidewalls of TSV trench 30 using conventional processes as known in the art. Liner 80 may then be formed on the sidewalls of TSV trench by thermal oxidation or any other known or later developed methods.

Figure 6:
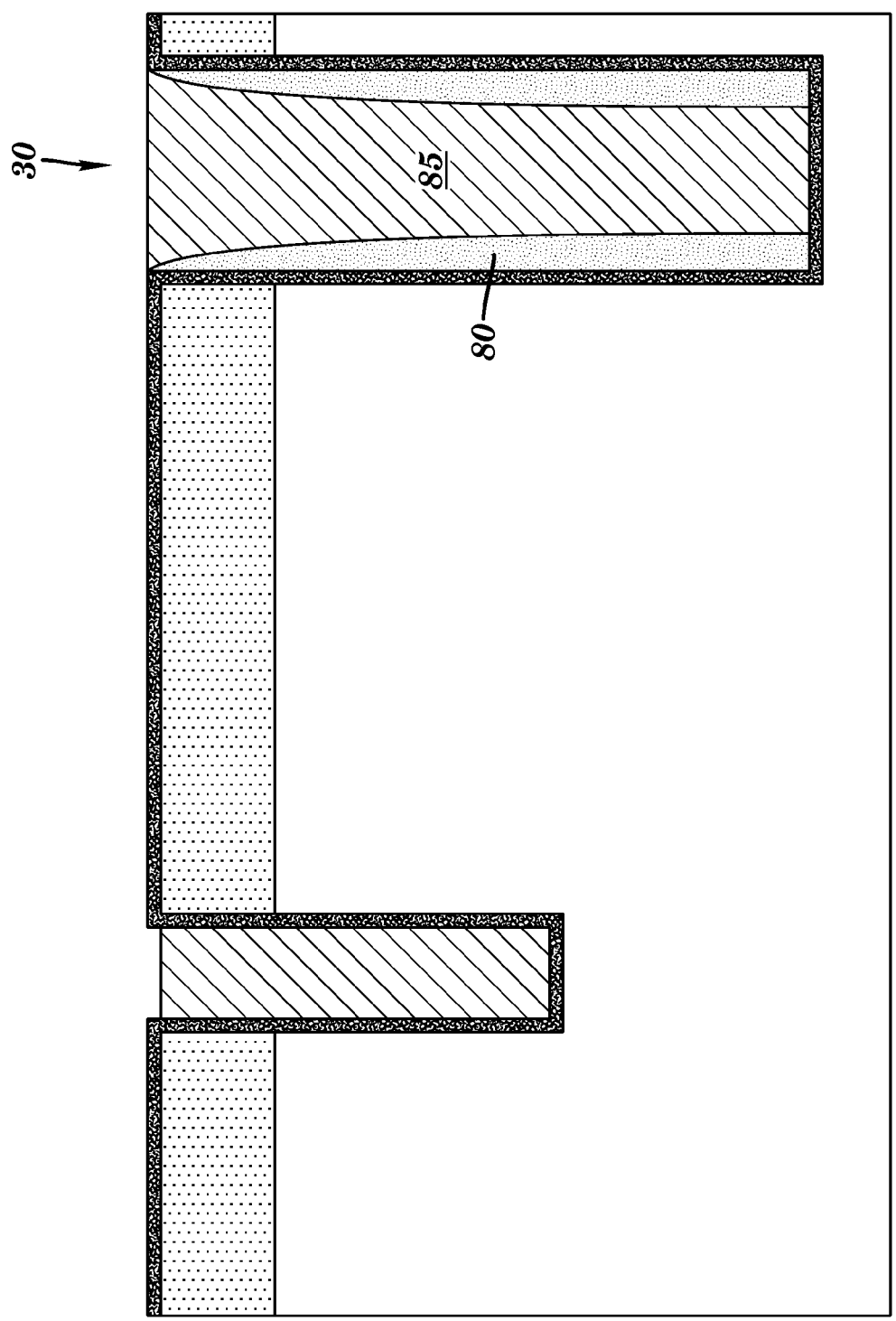

Referring to FIG. 6, TSV trench 30 is filled with conductive material 85. Conductive material 85 may include, but is not limited to: polycrystalline or amorphous silicon, germanium, silicon germanium, a metal, such as tungsten, titanium, tantalum, ruthenium, zirconium, cobalt, copper, aluminum, lead, platinum, tin, silver or gold, a conducting metallic compound material such as tantalum nitride, titanium nitride, tungsten silicide, tungsten nitride, ruthenium oxide, cobalt silicide or nickel silicide, carbon nanotube, conductive carbon, or any suitable combination of these materials. The conductive material may further comprise dopants that are incorporated during or after deposition. Conductive material may be deposited by CVD, ALD, plating or any other known or later developed methods. Conductive material 85 may be planarized by a chemical mechanical polishing (CMP) process or any other known or later developed processes.

Figure 7:
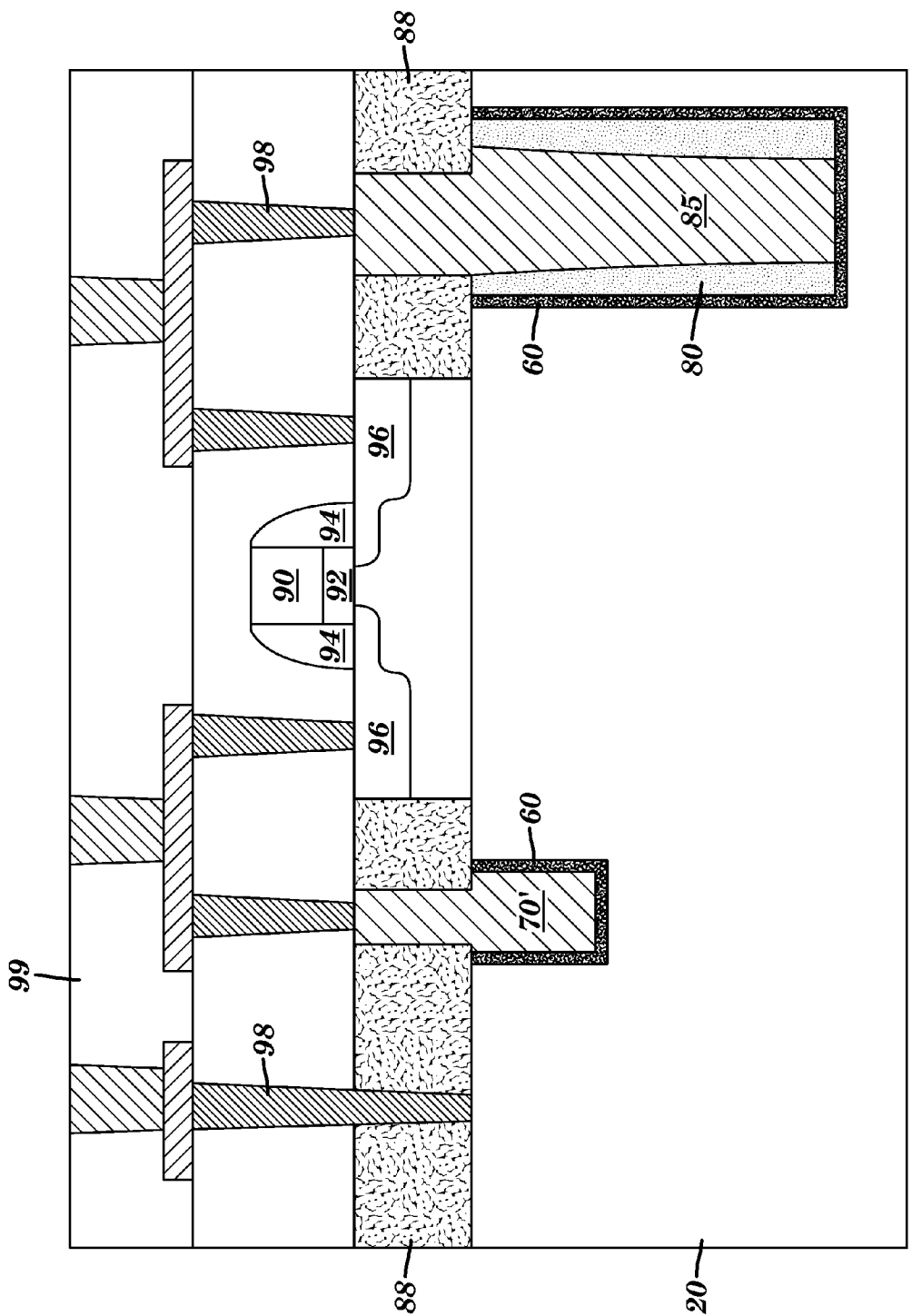

Referring to FIG. 7, DTCap trench 40 and TSV trench 30 may be filled with an insulating material to form shallow trench isolation (STI) regions 88. Conventional CMOS processes may be used to form devices, including a gate structure with a gate electrode 90, gate oxide layer 92, sidewall spacers 94 and source/drain regions 96. CA contacts 98 and BEOL devices 99 may be formed using conventional processes.

Figure 8:
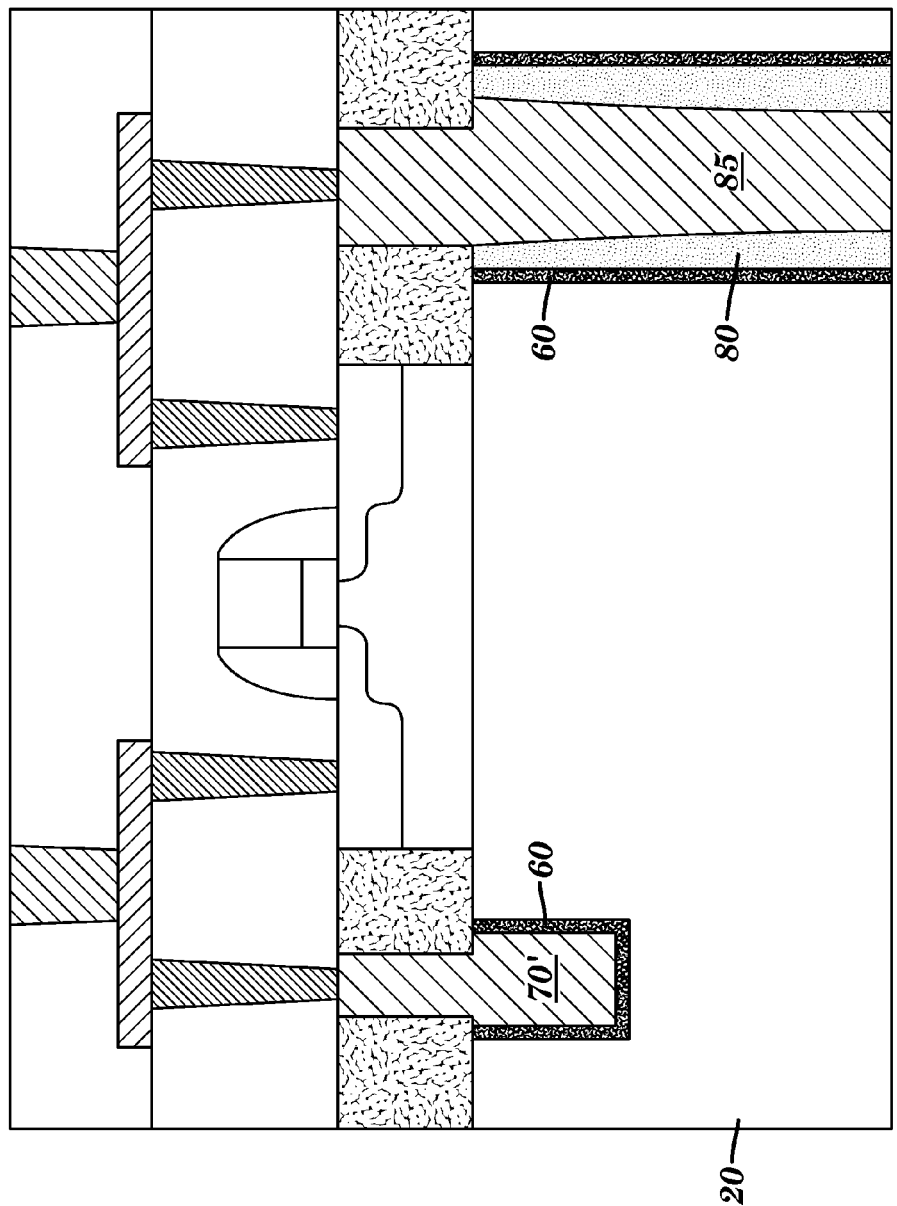
FIG. 8 shows processing steps and a final structure in accordance with an embodiment of the invention.

Referring to FIG. 8, substrate 20 is thinned from the backside, stopping on the bottom of TSV trench 30. Substrate 20 may be thinned using conventional processes such as grinding, polishing or etching and the like. Node dielectric 60 may be removed from the bottom of TSV trench 30 using conventional processes such as chemical etching by hot phosphoric acid and the like. A contact to the TSV (not shown) may be formed at the exposed bottom of TSV trench 30.

Figure 9:
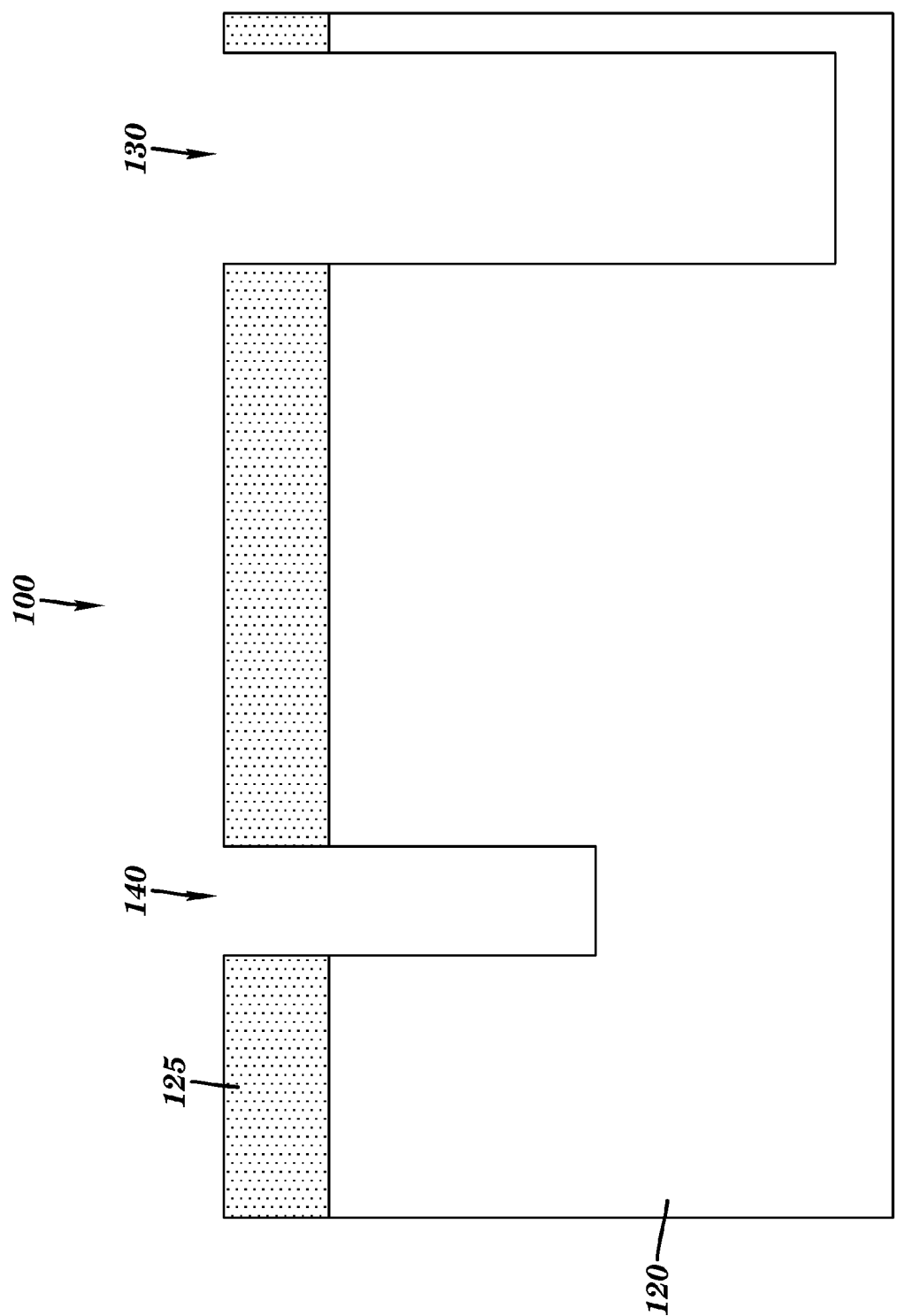
FIG. 9 shows a starting structure and processing steps in accordance with a second embodiment of the invention.

FIG. 9 shows a starting structure and processing steps in accordance with a second embodiment of the invention. Starting structure 100 includes a substrate 120. Substrate 120 may be a bulk semiconductor substrate, such as silicon, germanium or silicon germanium, SOI or other substrate known in the art. A pad film 125 is deposited on top of substrate 120. Pad film 125 may be deposited by conventional methods such as CVD, ALD, RTCVD, PECVD or any other known or later developed methods. Pad film 125 may comprise silicon nitride, silicon dioxide or other materials or combination of materials. Pad film 125 may have a thickness in a range from about 30 nm to 150 nm. Deep trenches 130, 140 are formed in substrate 120 by using conventional patterning techniques such as lithography and conventional etch processing such as RIE. Pad film 125 may be used as a mask. A wide trench 130 is formed for a TSV. A narrow trench 140 is formed for a deep trench isolation (DTI). Due to the difference of trench openings, wide trench 130 is deeper than narrow trench 140 after RIE. Trench 130 may have a depth in a range from about 10 um to 500 um. Trench 130 may have an aspect ratio (ratio between trench depth and trench width) in a range from about 5 to 50. Trench 140 may have a width in a range from about 0.1 um to 1 um. Trench 40 may have a depth in a range from about 3 um to 20 um. Trench 140 may have an aspect ratio (ratio between trench depth and trench width) in a range from about 5 to 50.

Figure 10:
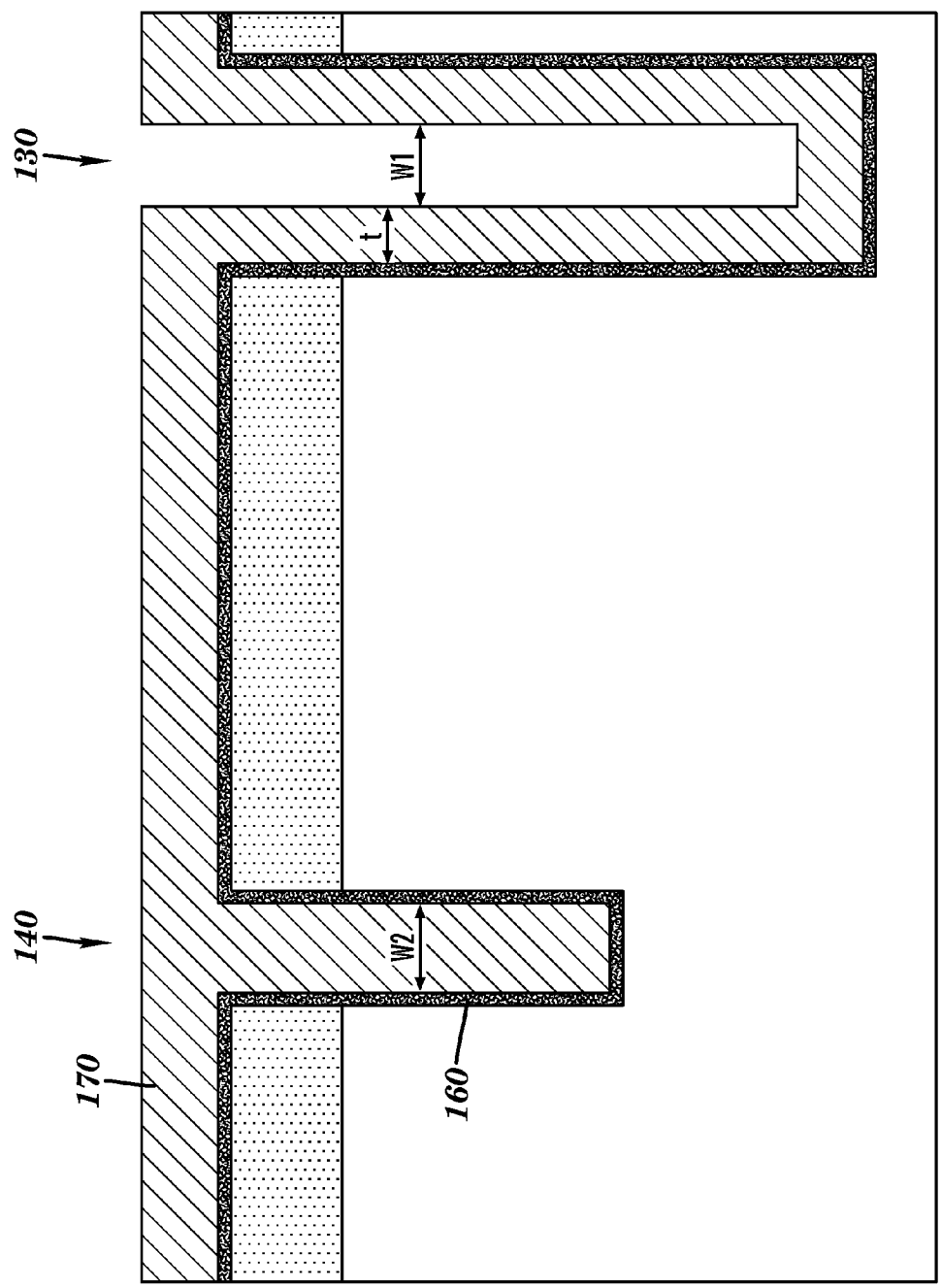
FIGS. 10-13 show processing steps and intermediate structures in accordance with the second embodiment of the invention.

Referring to FIG. 10, insulating material 170 is conformally deposited to completely fill DTI trench 140 and partially fill TSV trench 130. Insulating material 170 may include, but is not limited to: oxide, nitride, oxynitride, high-k material, or any suitable combination of those materials. Insulating material 170 may be deposited by conventional deposition methods such as LPCVD or any other known or later developed methods. Insulating material 170 may have a thickness of t which is greater than half the width, W2, of DTI trench 140, but less than half the width, W1, of TSV trench 130 (i.e., $½*W2<t<½*W1$). For example, W2 may be in a range of 0.1 um to 1 um, W1 may be in a range of 5 um to 50 um and t may be in a range of 1 um to 2 um. Optionally, a thin liner layer 160 may be formed on the pad film 125 and on the sidewalls and at the bottom of trenches 130, 140 prior to depositing insulator material 170 to improve interface quality. Liner layer 160 may be formed by conventional methods such as thermal oxidation or any other known or later developed methods. Liner layer 160 may include, but is not limited to: nitride, or high-k materials. Liner layer 160 may have a thickness in a range from about 2 nm to 20 nm.

Figure 11:
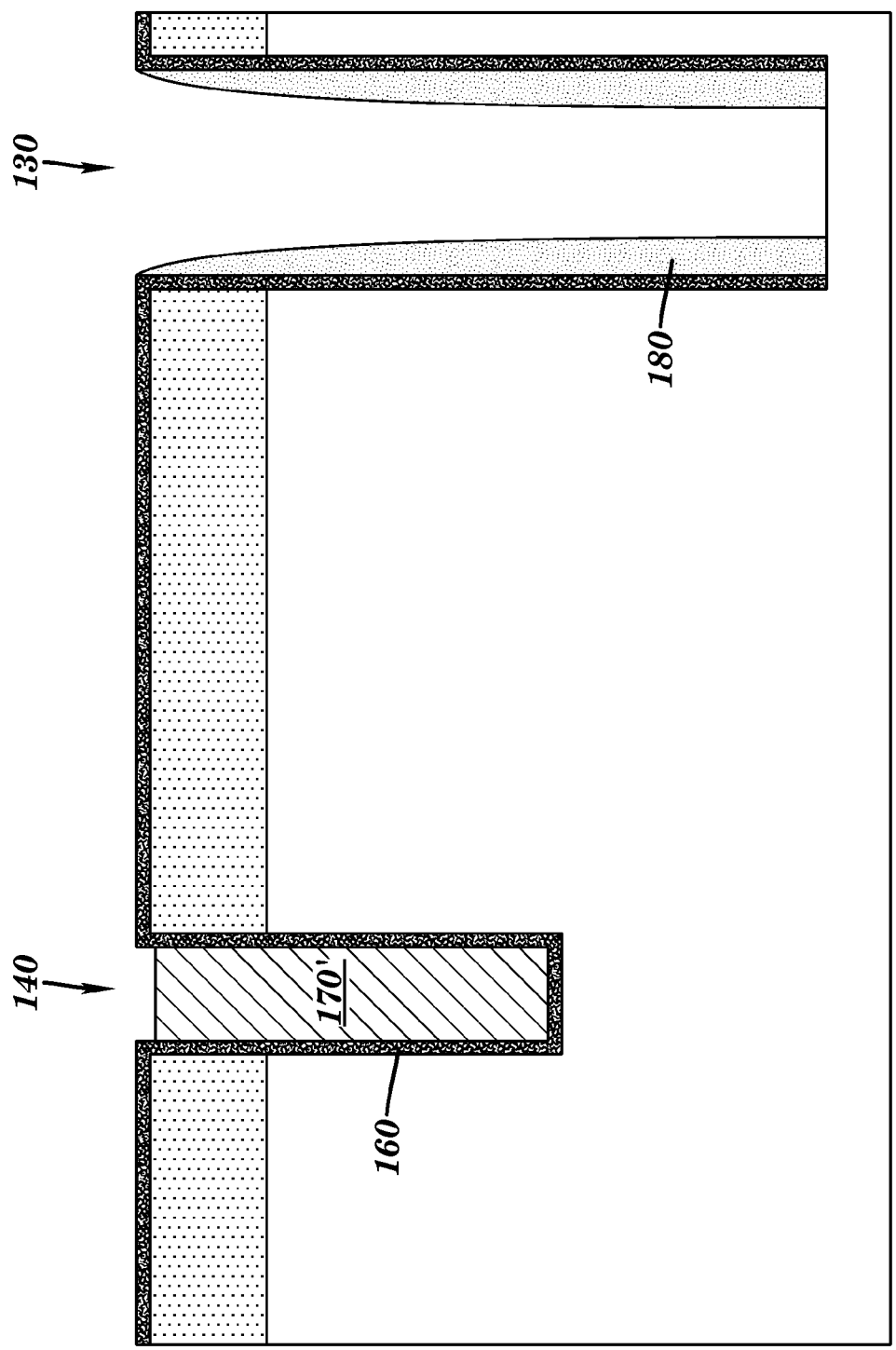

Referring to FIG. 11, insulating material 170 is removed from a top of the wafer surface, leaving insulating material 170' filling DTI trench 140. Insulating material 170 may be removed by RIE or any other known or later developed methods. When a directional RIE process is used to remove the insulating material 170, insulating material remains on the sidewall of TSV trench 130, forming a spacer liner 180. When an isotropic timed etch is used to remove the insulating material 170, the insulating material may be almost completely removed from the TSV trench 130. DTI trench 140 remains filled with the insulating material 170'.

Figure 12:
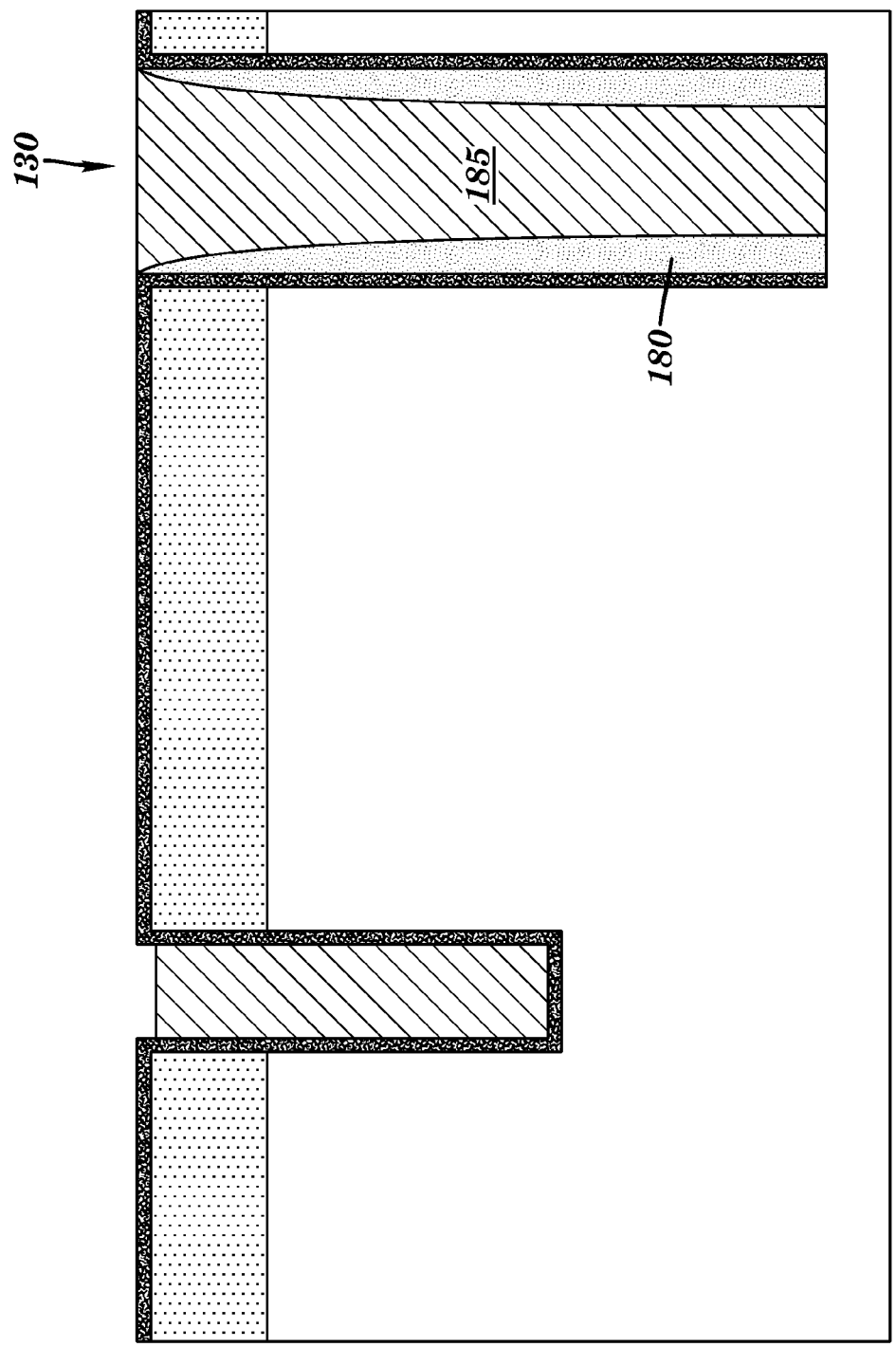

Referring to FIG. 12, TSV trench 130 is filled with conductive material 185. Conductive material 185 may include, but is not limited to: polycrystalline or amorphous silicon, germanium, silicon germanium, a metal, such as tungsten, titanium, tantalum, ruthenium, zirconium, cobalt, copper, aluminum, lead, platinum, tin, silver or gold, a conducting metallic compound material, such as tantalum nitride, titanium nitride, tungsten silicide, tungsten nitride, ruthenium oxide, cobalt silicide or nickel silicide, carbon nanotube, conductive carbon, or any suitable combination of these materials. The conductive material may further comprise dopants that are incorporated during or after deposition. Conductive material may be deposited by CVD, ALD, plating or any other known or later developed methods. Conductive material 185 may be planarized by a chemical mechanical polishing (CMP) process or any other known or later developed processes.

Figure 13:
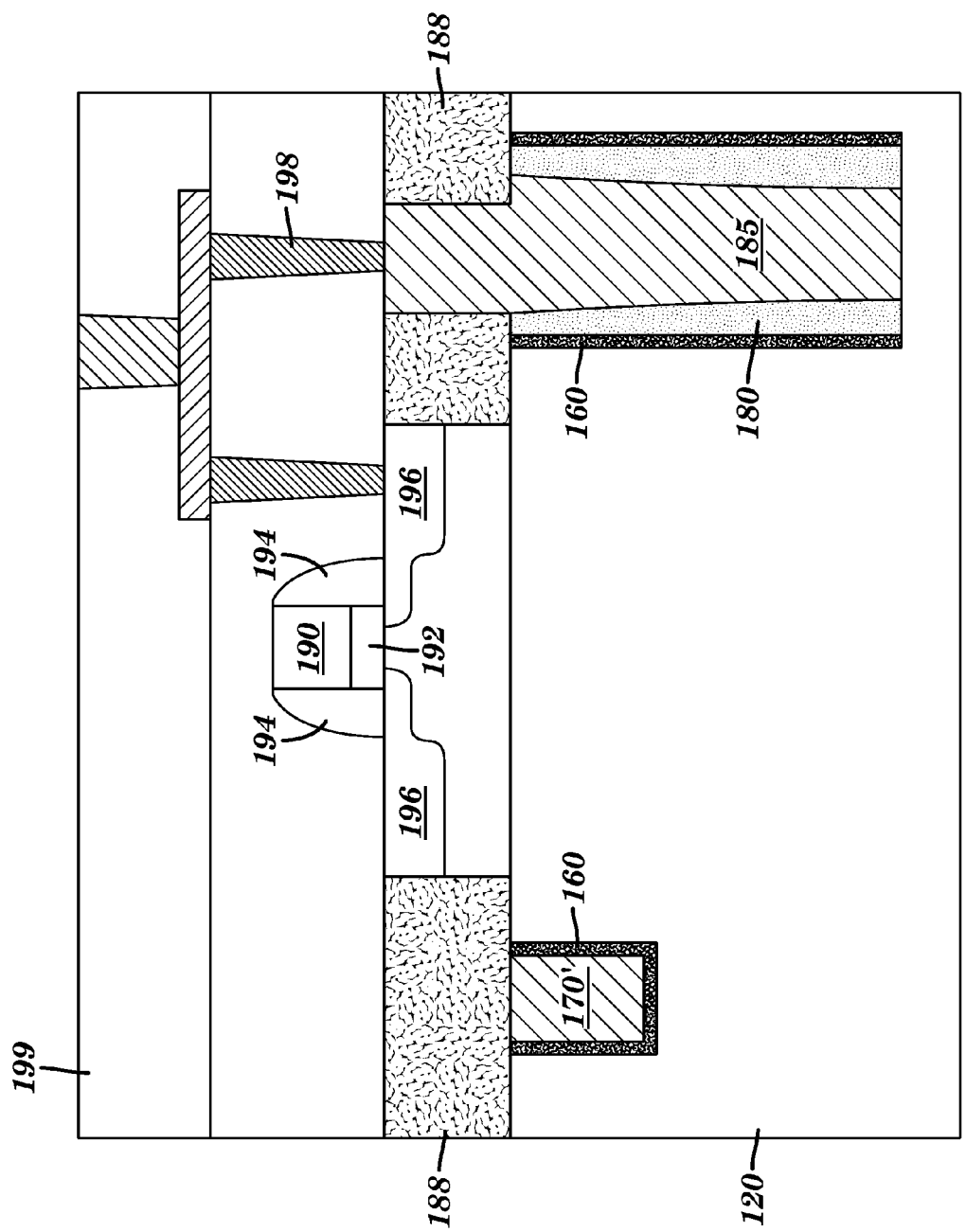

Referring to FIG. 13, DTI trench 140 and TSV trench 130 may be filled with an insulating material to form shallow trench isolation (STI) regions 188. Conventional CMOS processes may be used to form devices, including a gate structure with a gate electrode 190, gate oxide layer 192, sidewall spacers 194 and source/drain regions 196. CA contacts 198 and BEOL devices 199 may be formed using conventional processes.

Figure 14:
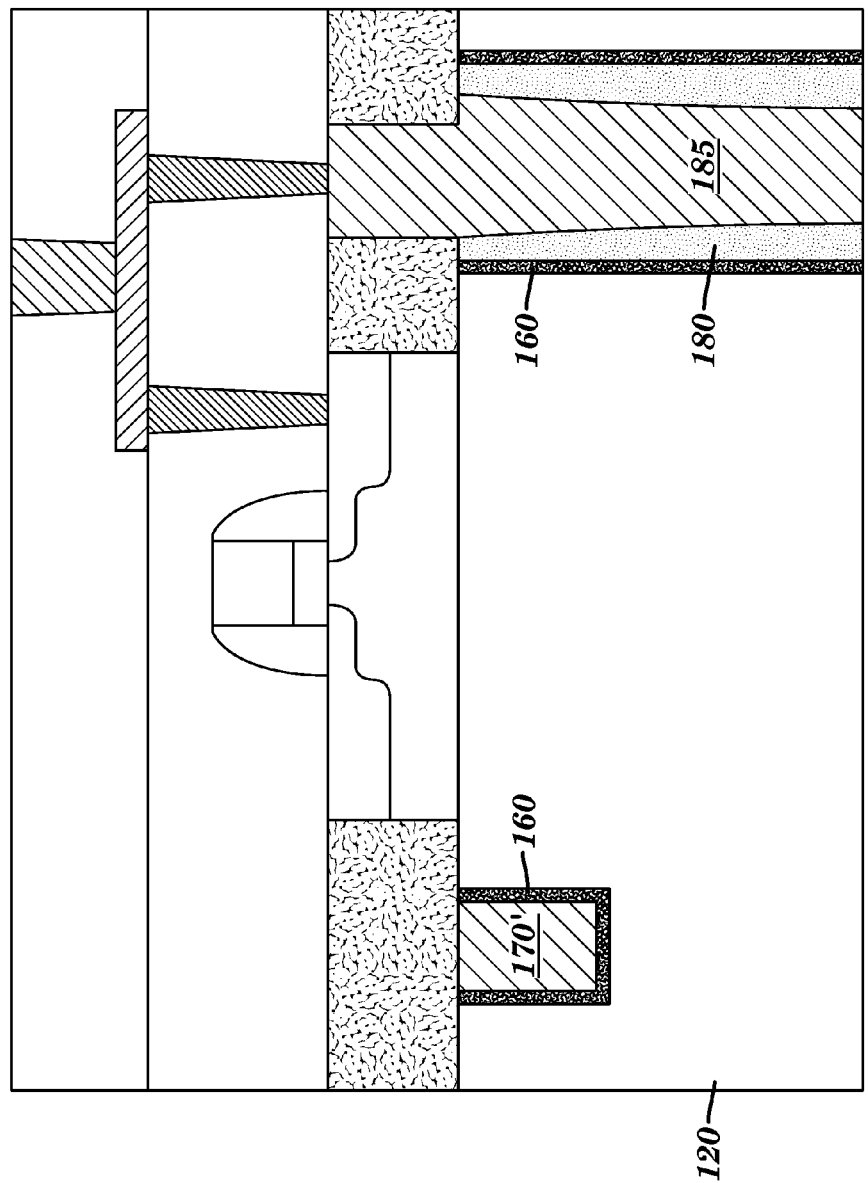
FIG. 14 shows processing steps and a final structure in accordance with an embodiment/the second embodiment of the invention.

Referring to FIG. 14, substrate 120 is thinned from the backside, stopping on the bottom of TSV trench 130. Substrate 120 may be thinned using conventional processes such as grinding, polishing or etching and the like. Liner layer 160 may be removed from the bottom of TSV trench 130 using conventional processes such as chemical etching by hot phosphoric acid and the like. A contact to the TSV (not shown) may be formed at the exposed bottom of TSV trench 130.

Design Structure

Figure 15:
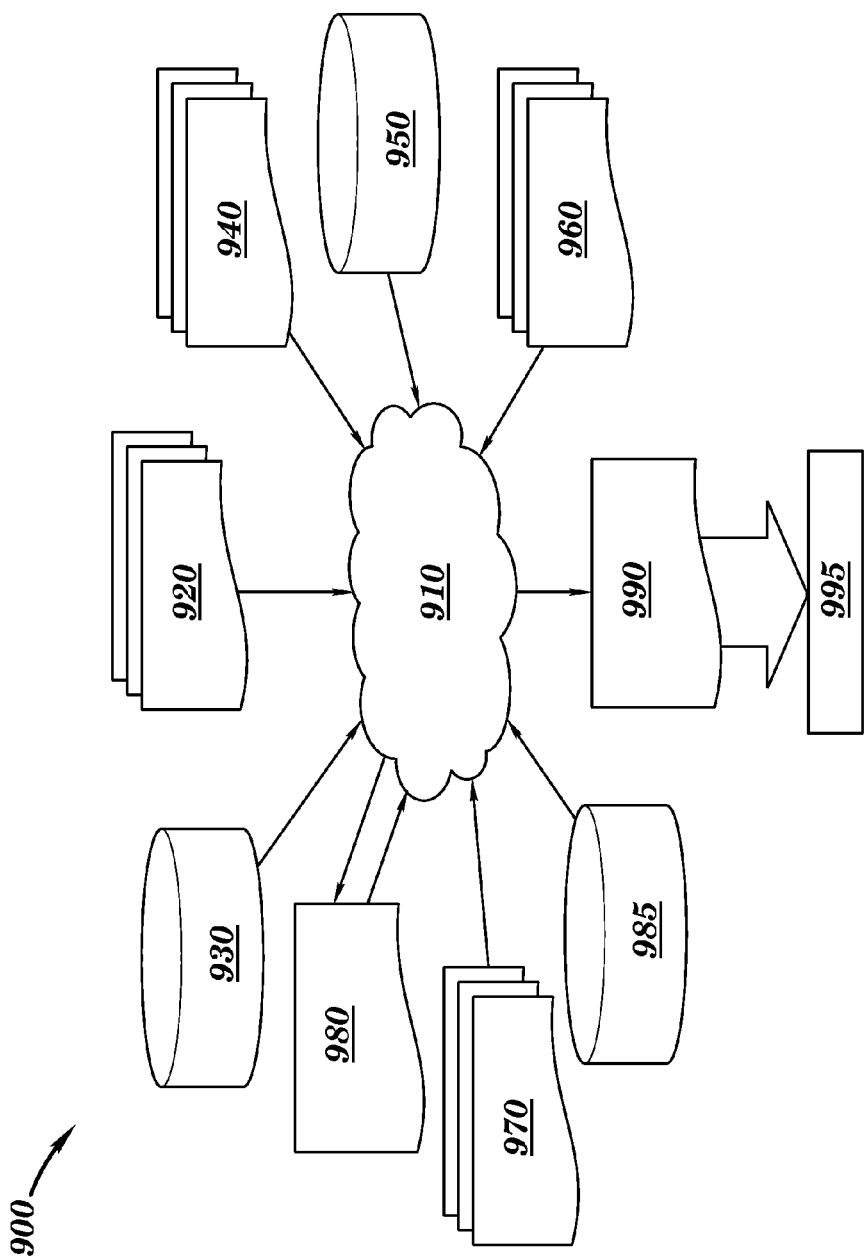
FIG. 15 shows a block diagram of an exemplary design flow used in semiconductor design, manufacturing, and/or test.

FIG. 15 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Alter® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-14 in the form of schematics or HDL, a hardware-description language (e.g., Virology, VHDL, C, etc.). Design structure 920 may be contained on one or more machine-readable media. For example, design structure 920 may be a text file or a graphical representation of an embodiment of the invention as shown in FIGS. 1-14. Design process 910 preferably synthesizes (or translates) embodiments of the invention as shown in FIGS. 1-14 into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-14, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a device, comprising:
providing a substrate;
depositing a pad film on top of the substrate;
simultaneously forming a first trench and a second trench in the substrate, wherein the first trench is wider and deeper than the second trench;
depositing a node dielectric layer on the pad film and on a bottom and sidewalls of both the first trench and the second trench;
depositing a first material over the node dielectric layer to completely fill the second trench and partially fill the first trench;
removing all of the first material from the first trench and some of the first material from the second trench;
depositing a liner only on sidewalls of the first trench;
depositing a conductive material to fill the first trench;
planarizing the conductive material;
thinning the substrate to the node dielectric layer at the bottom of the first trench; and
removing the node dielectric layer from the bottom of the first trench, wherein a bottom surface of the substrate is substantially coplanar with a bottom surface of the conductive material.

2. The method according to claim 1, wherein the first material is a conductive material.

3. The method according to claim 2, wherein the first trench is a through silicon via (TSV) and the second trench is a deep trench capacitor (DTCap) and the liner is thicker than the node dielectric layer.

4. The method according to claim 1, wherein the first material is an insulating material.

5. The method according to claim 4, wherein the first trench is a through silicon via (TSV) and the second trench is a deep trench isolation (DTI).

6. The method according to claim 1, wherein the first trench and the second trench are formed by using the pad film as a mask and performing a reactive ion etch (RIE).

7. A method of forming a device, comprising:
providing a substrate;
depositing a pad film on top of the substrate;
simultaneously forming a wide trench for a through silicon via (TSV) and a narrow trench for a deep trench capacitor (DTCap) in the substrate;
depositing a node dielectric layer on the pad film and on a bottom and sidewalls of both the wide trench and the narrow trench;
depositing a first conductive material over the node dielectric layer to completely fill the narrow trench and partially fill the wide trench;
removing all of the first conductive material from the wide trench and some of the first conductive material from the narrow trench;
depositing a liner only on sidewalls of the wide trench;
depositing a second conductive material to fill the wide trench;
planarizing the second conductive material;
thinning the substrate to the node dielectric layer at a bottom of the wide trench; and
removing the node dielectric layer from the bottom of the wide trench, wherein a bottom surface of the substrate is substantially coplanar with a bottom surface of the conductive material.

8. The method according to claim 7, wherein the substrate is one of a bulk semiconductor and a semiconductor-on-insulator (SOI).

9. The method according to claim 7, wherein the pad film is deposited by chemical vapor deposition (CVD), atomic layer deposition (ALD), rapid thermal chemical vapor deposition (RTCVD) or plasma enhanced chemical vapor deposition (PECVD).

10. The method according to claim 7, wherein the node dielectric layer is deposited by chemical vapor deposition (CVD).

11. The method according to claim 10, wherein the node dielectric layer is selected from the group consisting of: silicon nitride, silicon oxide, oxynitride and high-k dielectric.

12. The method according to claim 11, wherein the node dielectric layer has a thickness in a range from about 3 nm to 20 nm.

13. The method according to claim 7, wherein the first conductive material is selected from the group consisting of: polycrystalline, amorphous silicon, germanium, silicon germanium, tungsten, titanium, tantalum, ruthenium, zirconium, cobalt, copper, aluminum, lead, platinum, tin, silver, gold, tantalum nitride, titanium nitride, tungsten silicide, tungsten nitride, ruthenium oxide, cobalt silicide, nickel silicide, carbon nanotube and conductive carbon.

14. The method according to claim 13, wherein the first conductive material has a thickness, t, greater than half the width, W2, of the narrow trench and less than half the width, W1, of the wide trench.

15. The method according to claim 7, wherein the liner is an oxide.

16. The method according to claim 15, wherein the liner has a thickness in a range from about 10 nm to 100 nm.

17. The method according to claim 7, wherein the second conductive material is one of a doped polysilicon and a metal or a combination of both.

18. The method according to claim 7, wherein the planarizing step comprises performing a chemical mechanical polishing (CMP).

19. A method of forming a device, comprising:
providing a substrate;
depositing a pad film on top of the substrate;
simultaneously forming a through silicon via (TSV) trench and a deep trench isolation (DTI) trench in the substrate;
depositing an insulating material to completely fill the DTI trench and partially fill the TSV trench;
removing insulting material from the TSV trench and the DTI trench, wherein a spacer liner is formed only on sidewalls of the TSV trench;
depositing a conductive material to fill the TSV trench;
planarizing the conductive material; and
thinning the substrate to a bottom of the TSV trench.

20. The method according to claim 19, wherein the pad film is one of silicon nitride and silicon dioxide.

\* \* \* \* \*